United States Patent
Wu

[11] Patent Number: 6,037,225
[45] Date of Patent: Mar. 14, 2000

[54] MANUFACTURING METHOD FOR MASK ROM DEVICES

[75] Inventor: Shye-Lin Wu, Hsinchu, Taiwan

[73] Assignee: Texas Instruments Acer Incorporated, Hsinchu, Taiwan

[21] Appl. No.: 09/060,566

[22] Filed: Apr. 14, 1998

[51] Int. Cl.[7] .................................................. H02L 21/265
[52] U.S. Cl. ...................... 438/262; 438/276; 438/280; 438/275; 438/257; 257/390; 257/391
[58] Field of Search ........................... 438/199, 238, 438/257, 258, 259, 260, 261, 262, 275, 276, 263, 278, 289, 290, 296; 257/905, 315, 316, 317, 318

[56] References Cited

U.S. PATENT DOCUMENTS

| | | | |
|---|---|---|---|
| 5,308,777 | 5/1994 | Hong | 438/278 |
| 5,538,906 | 7/1996 | Aoki | 438/278 |
| 5,595,927 | 1/1997 | Chen et al. | 438/270 |
| 5,631,178 | 5/1997 | Vogel et al. | 438/200 |
| 5,683,925 | 11/1997 | Irani et al. | 438/278 |
| 5,688,661 | 11/1997 | Choi | 438/278 |
| 5,882,972 | 3/1999 | Hong et al. | 438/276 |

*Primary Examiner*—Mahshid Saadat
*Assistant Examiner*—N. Drew Richards
*Attorney, Agent, or Firm*—Harness, Dickey & Pierce, P.L.C.

[57] ABSTRACT

The present invention includes forming word lines on a substrate. Next, nitride spacers are formed on the side walls of the word lines. In the cell area, a photoresist is patterned on the substrate to cover a coding region. Then, an ion implantation with n type conductive dopant is carried out to form buried bit lines in the cell area and in the peripheral area adjacent to the word lines. Afterwards, the photoresist is stripped. A high temperature thermal oxidation is then performed to activate the dopant and to form thick oxide structures to isolate the adjacent buried bit lines.

20 Claims, 5 Drawing Sheets

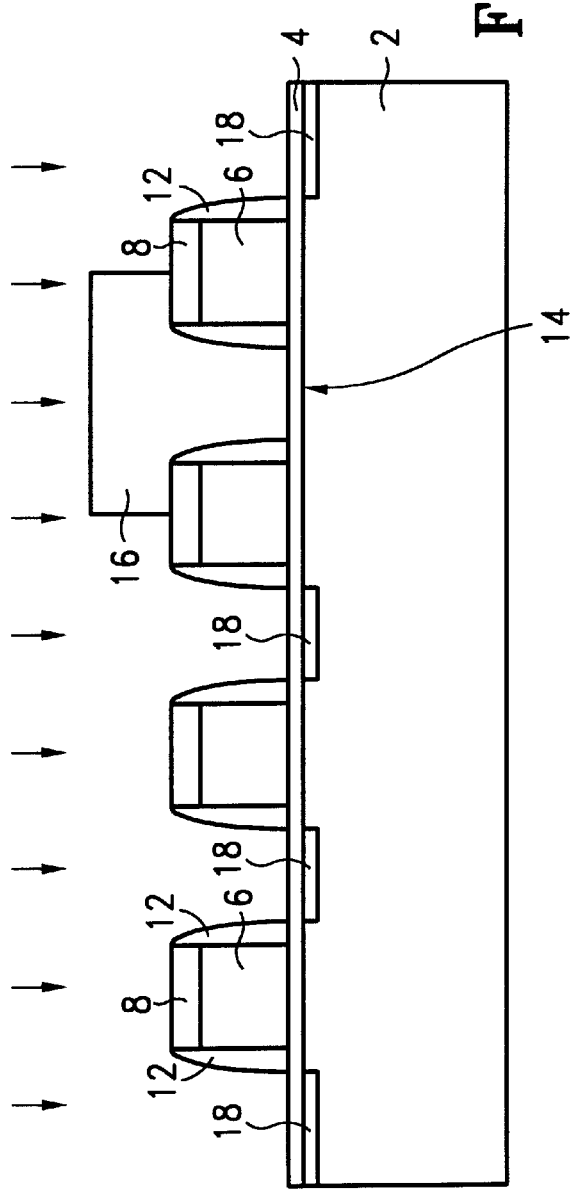
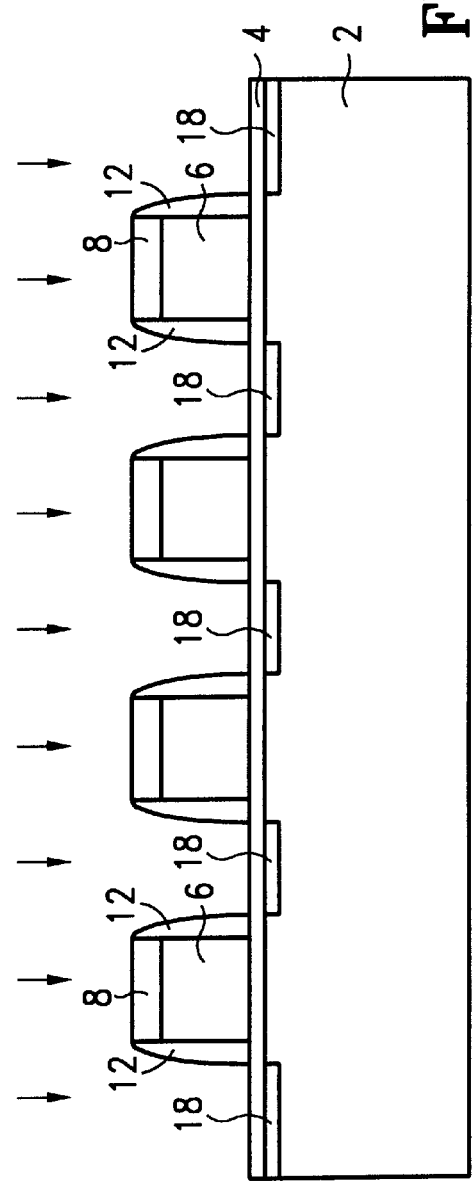

6,037,225

MANUFACTURING METHOD FOR MASK ROM DEVICES

FIELD OF THE INVENTION

The present invention relates to semiconductor devices, specifically to mask read only memories (ROM).

BACKGROUND

Recently, significant advances have been obtained to meet the need for Ultra Large Scale Integrated (ULSI) circuits. The development memory devices is continuously driven by new applications. For example, computer interfaces will come to be operated by speech processing or vision processing, and other communication interfaces, all of which require a lot of memory. Read only memory (ROM) devices include ROM cells for coding data and a peripheral controlling devices to control the operation of the cells. Each bit of data is stored in a cell, which is a single n-channel transistor or ROM cell.

Typically, mask ROM includes devices with different threshold voltages. A type of device is formed in an active area and another type of device with a threshold voltage mask is formed in another active area during the process. In MOS transistors for mask ROM, the threshold voltages of the channel regions under the gates are set to the same before data writing. Thereafter, ions are selectively implanted into determined regions to differentiate the threshold voltages thereof for data writing.

One of the methods that involves differentiating the threshold voltages is achieved by the ion implantation of some of the transistor gates. This method raises the threshold voltage of the n-channel device by doping boron with a heavy dose. This method is so called threshold voltage programming. There are two other methods for programming which are field oxide programming and through-hole programming. Each of these programming methods can be implemented at different stages of the process.

In order to achieve the above object, it is known to obtain different threshold voltages by ion implantation through sacrificing oxide into the silicon substrate. For example, in U.S. Pat. No. 5,538,906 to Hitoshi, a method is proposed to form devices with different threshold voltages. However, the high dose boron implantation will result in a lower junction leakage breakdown voltage of the coded MOS and; more importantly, to a very high band-to-band leakage current as mentioned in U.S. Pat. No. 5,683,925. As the gate is decreased down, the oxide must be made thinner in order to provide the same threshold voltage. The higher the dosage for changing the threshold voltage, the more band-to-band current is generated per cell. Thus, Rustom et al. disclose a method of forming ROM without increasing significant band-to-band leakage. The present invention proposes an easier way to manufacture the ROM without additional channel coding implantation.

SUMMARY

A plurality of word lines are formed by patterning a silicon nitride layer, a polysilicon layer and a gate oxide layer. Then, the photoresist is stripped. Next, nitride spacers are formed on the side walls of the word lines. The next step is to create a buried bit line both for the area in a cell and a peripheral area. In the cell area, a photoresist is patterned on the substrate to cover a coding region. Then, an ion implantation with n type conductive dopant, such as phosphorus, is carried out to form the source and drain regions to serve as buried bit lines in the cell area and in the peripheral area adjacent to the word lines. Afterwards, the photoresist is stripped. A high temperature thermal oxidation is then performed in an ambient containing oxygen to activate the dopant, thereby forming thick oxide structures in the cell area and the peripheral area to isolate the adjacent buried bit lines.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 5A and FIG. 5B are cross-sectional views of a semiconductor substrate illustrating the step of performing an ion implantation to the semiconductor substrate according to the present invention.

DETAILED DESCRIPTION

Figure 1:
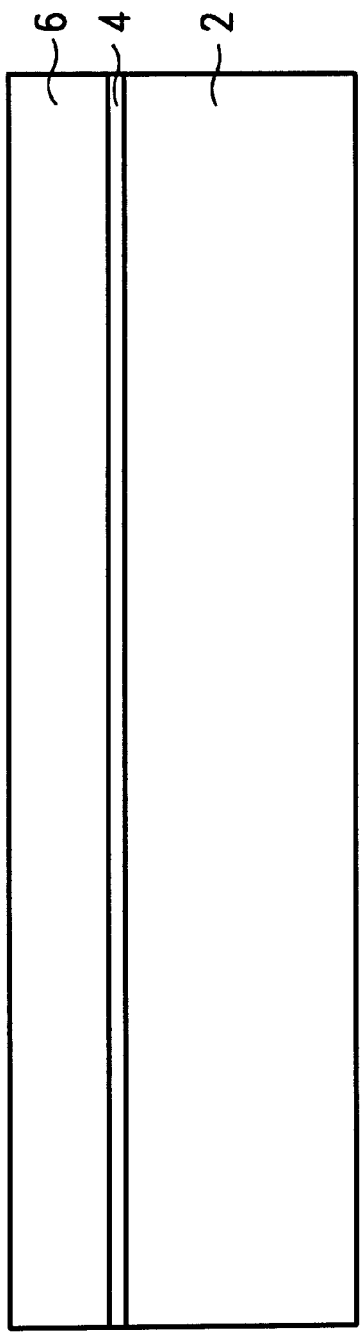
FIG. 1 is a cross-sectional view of a semiconductor substrate illustrating the steps of forming a gate oxide layer and a polysilicon layer on the semiconductor substrate according to the present invention.

The present invention proposes a novel method of fabricating NMOS transistors with two different threshold voltages for mask ROM devices. The detailed description can be seen as follows. Referring to FIG. 1, a single crystal substrate with a <100> crystallographic orientation is used for the preferred embodiment. Isolation regions (not shown) are created for the purposes of isolation. In a case, FOX (field oxide) regions are created to achieve the purpose. Typically, the memory device includes a cell area surrounded by a peripheral area consisting of by n-channel transistors. The cell area includes a multiplicity of ROM transistors. Therefore, the first step of the present invention is to create transistors on the substrate 2 both in the cell area and in the peripheral area. In order to achieve this, gate structures are defined by means of conventional processes. For example, a thin oxide layer 4 is formed on the substrate 2 to act as a gate oxide by using an oxygen-steam ambient at a temperature of between about 800 to 1100 degrees centigrade. Alternatively, the gate oxide 4 may be formed using other known oxide chemical compositions and procedures. In the preferred embodiment, the thickness of the gate oxide layer 4 is about 15–200 angstroms. A polysilicon layer 6 having heavy n type conductive dopant (n+) is deposited by chemical vapor deposition on the gate oxide layer 4.

Figure 2:
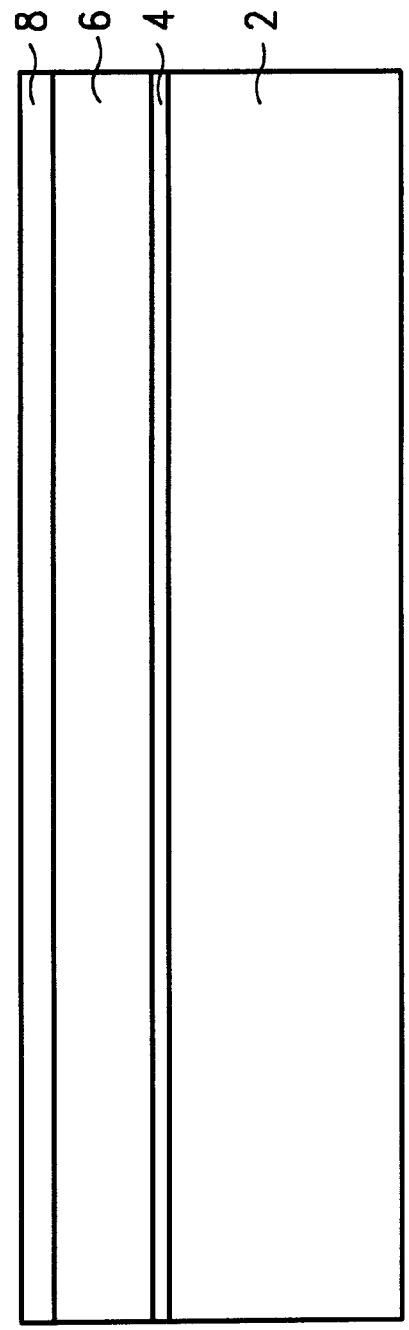
FIG. 2 is a cross-sectional view of a semiconductor substrate illustrating the step of forming a silicon nitride layer on the semiconductor substrate according to the present invention.

A thin silicon nitride layer 8 is deposited on the polysilicon layer 6. The layer 8 is used to serve as an anti-reflective coating (ARC) for subsequent lithography technology to define a narrower polysilicon gate, as shown in FIG. 2. In general, the silicon nitride layer 8 can be deposited by any suitable process such as Low Pressure Chemical Vapor Deposition (LPCVD), Plasma Enhance Chemical Vapor Deposition (PECVD), Electron Cycltron Remote Chemical Vapor Deposition (ECRCVD). The thickness of the silicon nitride layer is about 300 to 1000 angstroms. Further, the temperature to form the silicon nitride layer 8 is at a range of 300–800° C. In the preferred embodiment, the reaction gases of the step to form silicon nitride layer 8 are $SiH_4$, $NH_3$, $N_2$, $N_2O$ or $SiH_2Cl_2$, $NH_3$, $N_2$, $N_2O$.

Figure 3:
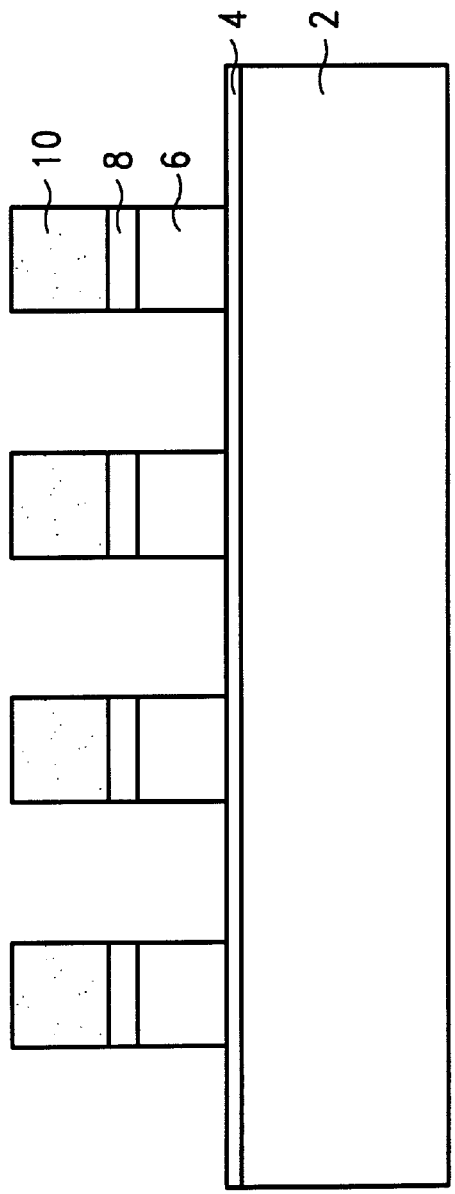
FIG. 3 is a cross-sectional view of a semiconductor substrate illustrating the step of forming word lines on the semiconductor substrate according to the present invention.
Figure 4:
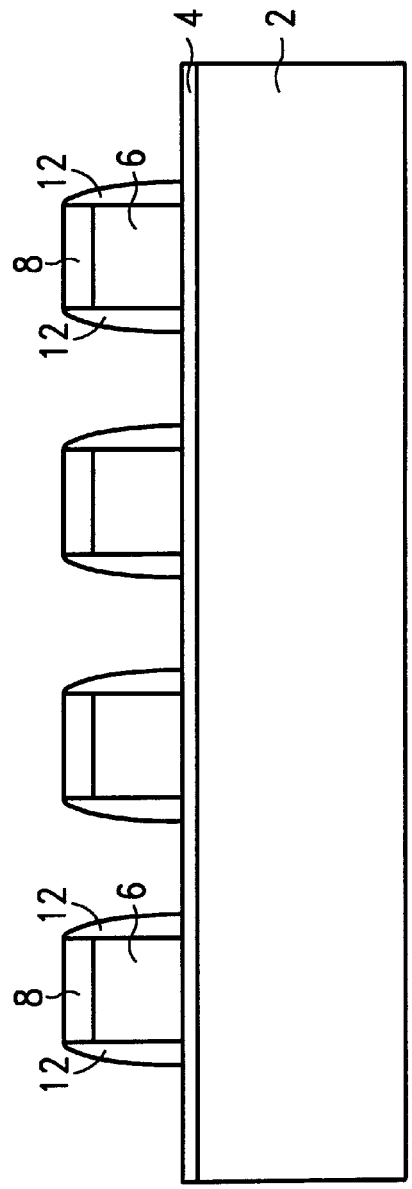
FIG. 4 is a cross-sectional view of a semiconductor substrate illustrating the step of forming spacers on the side walls of the word lines according to the present invention.

Turning to FIG. 3, the silicon nitride layer 8 and the polysilicon layer 6 are patterned to define the gates on the substrate 2 by using a photoresist 10 as a mask. These gates act as word lines. Then, the photoresist 10 is stripped by a conventional manner. Next, and referring to FIG. 4, nitride spacers 12 are formed on the side walls of the etched polysilicon layer 6 by means of forming a silicon nitride layer then etching the layer. Thereafter, nitride spacers 12 are formed by the anisotropic etching.

Figure 6A:
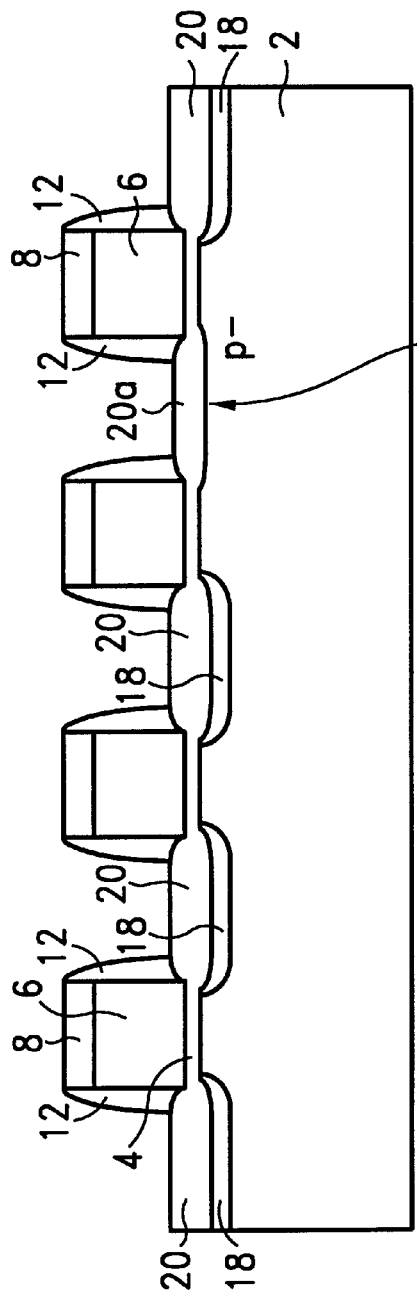
FIG. 6A and FIG. 6B are a cross-sectional views of a semiconductor substrate illustrating the step of performing a thermal oxidation to the semiconductor substrate according to the present invention.
Figure 6B:
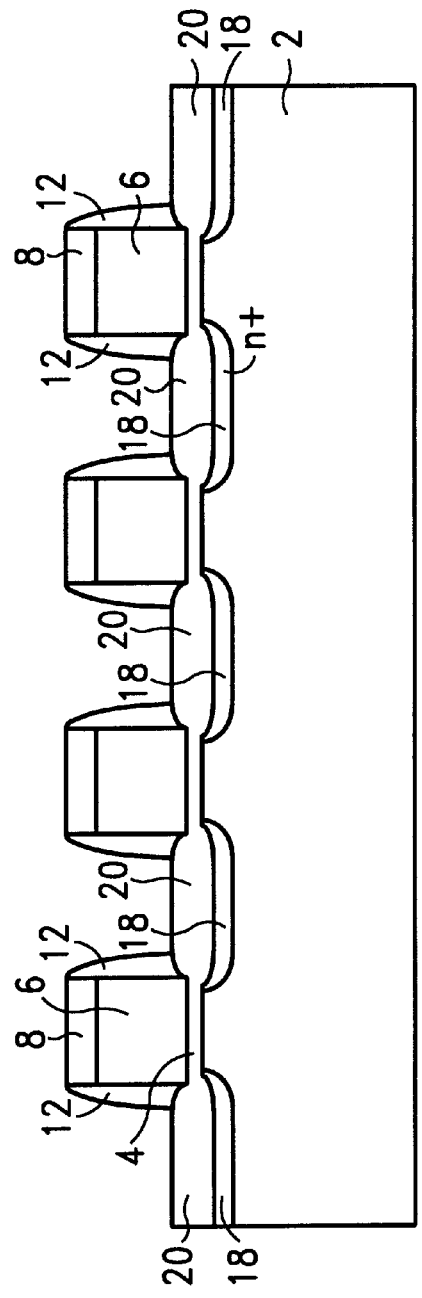

The next step is to create buried bit lines for both the cell area and the peripheral area. In order to provide a clear description herein, the cross-sectional views according to the step are shown in FIG. 5A and FIG. 5B. FIG. 5A indicates the profile in accordance with the cell area including the coding region 14, whereas FIG. 5B indicates the profile in accordance with the peripheral area consisting of n-channel MOS transistors. FIG. 6A and FIG. 6B respectively illustrate the slice of FIG. 5A and FIGURE 5B at next stage of its fabrication. In the cell area, a photoresist 16 is patterned on the substrate 2 to cover the coding region 14. Then, an ion implantation with n type conductive dopant, such as phosphorus, is carried out to form the source and drain regions to serve as buried bit lines 18 both in the cell area and in the peripheral area adjacent the word lines. The energy and dosage of the implantation are about 0.5 to 100 KeV, 1E14 to 5E16 atoms/cm$^2$, respectively. As shown in FIG. 5A, for the coded NMOS device, the n+source and drain is shielded with the photoresist 16. Afterwards, the photoresist 16 is stripped away by using well known technology.

Turning to FIG. 6A and FIG. 6B, a high temperature thermal oxidation is performed in an ambient containing oxygen to activate the dopant, thereby forming a buried bit line profile. Simultaneously, a plurality of oxide structures 20 are generated both in the cell area and in the peripheral area, and on the top of the buried bit lines 18 to isolate the adjacent buried bit lines. Thus, the coded NMOS device has a high resistive source and drain region and only a very small current can be pass the region. This results in a nearly normally off NMOS device when a high level bias is applied to the gate. Preferably, the temperature for this step can range from 800 to 1100 degrees centigrade.

Figure 7:
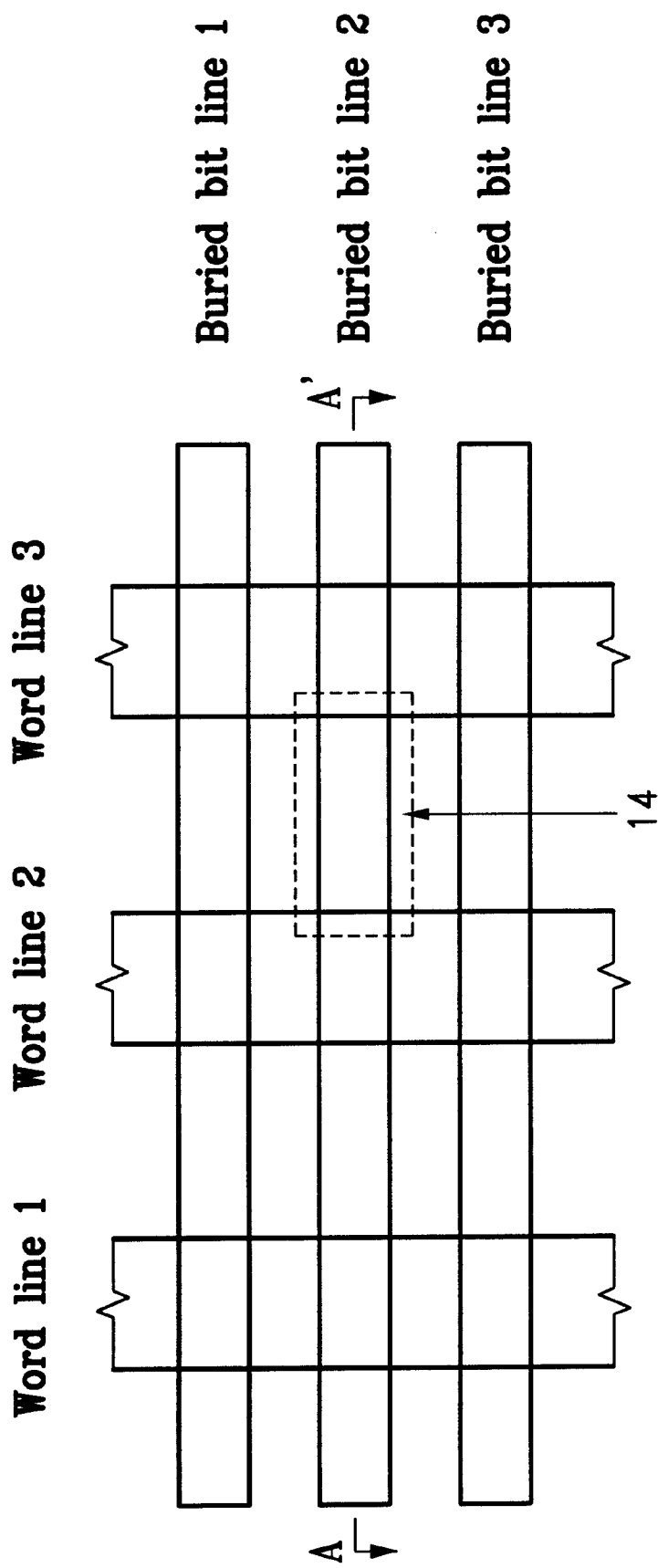
FIG. 7 is a top view of high density buried bit line NAND-gate mask ROM according to the present invention.

FIG. 7 is a mask ROM array scheme according to the present invention, which shows the top view of the high density buried bit line NAND-gate mask ROM. FIG. 6A and FIG. 6B are cross-sectional views taken from the A–A' line of FIG. 7. In FIG. 7, a plurality of vertical lines used as word lines (word line 1, word line 2, word line 3, . . . ) are configured over a substrate. The buried bit lines (buried bit line 1, buried bit line 2, buried bit line 3, . . . ) are arranged vertically with respect to each word line. A coding region 14 is formed between two adjacent word lines.

As can be appreciated from the above disclosure, the present invention provides the following advantages: (1)

The high dosage boron implant which induces a lower junction breakdown and a higher leakage current of the conventional coded NMOS devices will be avoided, since the present invention involves no additional channel coding implant; (2) the proposed method can save one mask; (3) the proposed method is easy to control for manufacturing.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a mask ROM (read only memory) device on a semiconductor substrate having a cell area for coding, and a NMOS device area, said method comprising:

forming word lines on said semiconductor substrate;

forming spacers on side walls of said word lines;

patterning a first photoresist on a coding region in said cell area;

performing an ion implantation by using said first photoresist as a mask to form buried bit lines in said substrate between said word lines;

removing said first photoresist; and performing a thermal oxidation to activate the dopant in said semiconductor substrate and to form oxide structures on said buried bit lines to isolate said buried bit lines.

2. The method of claim 1, further comprising the following steps to form said word lines:

forming an oxide layer on said semiconductor substrate;

forming a polysilicon layer on said oxide layer;

forming a first nitride layer on said polysilicon layer;

patterning said first nitride layer and said polysilicon layer by using a second photoresist; and removing said second photoresist.

3. The method of claim 1, wherein the energy of said ion implantation is 0.5 to 100 KeV.

4. The method of claim 1, wherein the dosage of said ion implantation is 1E14 to 5E16 atoms/cm$^2$.

5. The method of claim 1, wherein the dopant of said ion implantation comprises n type conductive dopant.

6. The method of claim 5, wherein said n type conductive dopant comprises arsenic.

7. The method of claim 5, wherein said n type conductive dopant comprises phosphorus.

8. The method of claim 1, wherein said spacers comprises nitride spacers.

9. The method of claim 8, further comprising the following steps to form said nitride spacers:

forming a second nitride layer on said word lines; and performing an anisotropically etching to etch said second nitride layer.

10. The method of claim 1, wherein said thermal oxidation is performed at a temperature 800 to 1100 degrees centigrade.

11. The method of claim 1, wherein said thermal oxidation is performed in an ambient containing oxygen.

12. A method for manufacturing a mask ROM (read only memory) device having a cell area for coding, wherein said cell area has a coding region, said method comprising:

forming word lines on said cell area;

forming side wall spacers on side walls of said word lines;

patterning a photoresist on said coding region;

performing an ion implantation by using said photoresist as a mask to form buried bit lines in said cell area between said word lines;

removing said photoresist; and performing a thermal oxidation to activate the dopant in said cell area and to form oxide structures on said buried bit lines to isolate said buried bit lines.

13. The method of claim 12, wherein the energy of said ion implantation is 0.5 to 100 KeV.

14. The method of claim 12, wherein the dosage of said ion implantation is 1E14 to 5E16 atoms/cm$^2$.

15. The method of claim 12, wherein the dopant of said ion implantation comprises n type conductive dopant.

16. The method of claim 15, wherein said n type conductive dopant comprises arsenic.

17. The method of claim 15, wherein said n type conductive dopant comprises phosphorus.

18. The method of claim 12, wherein said spacers comprises nitride spacers.

19. The method of claim 12, wherein said thermal oxidation is performed at a temperature 800 to 1100 degrees centigrade.

20. The method of claim 12, wherein said thermal oxidation is performed in an ambient containing oxygen.

* * * * *